United States Patent [19]
Tanaka et al.

[11] 4,184,971
[45] * Jan. 22, 1980

[54] FERROMAGNETICPIEZOELECTRIC CERAMIC COMPOSITION

[75] Inventors: Yoichi Tanaka; Masamichi Tsuruta; Koji Takahashi, all of Chiba; Tsutomu Hasegawa, Tokyo; Makoto Hori, Chiba, all of Japan

[73] Assignee: TDK Electronic Co., Tokyo, Japan

[*] Notice: The portion of the term of this patent subsequent to Mar. 2, 1995, has been disclaimed.

[21] Appl. No.: 828,193

[22] Filed: Aug. 26, 1977

Related U.S. Application Data

[63] Continuation of Ser. No. 709,714, Jul. 29, 1976, abandoned, which is a continuation-in-part of Ser. No. 420,653, Nov. 30, 1973, Pat. No. 4,087,366.

[51] Int. Cl.$^2$ .................... C04B 35/46; C04B 35/48
[52] U.S. Cl. .................................................. 252/62.9
[58] Field of Search ........................... 252/62.9 PA

[56] References Cited

U.S. PATENT DOCUMENTS

| | | |
|---|---|---|
| 3,518,199 | 6/1970 | Tsubovchi et al. .............. 252/62.9 |
| 3,649,540 | 3/1972 | Nishida et al. .................. 252/62.9 |
| 3,661,781 | 5/1972 | Ichmose et al. ................. 252/62.9 |
| 3,669,887 | 6/1972 | Nishida et al. .................. 252/62.9 |

FOREIGN PATENT DOCUMENTS

| | | |
|---|---|---|
| 2001290 | 8/1971 | Fed. Rep. of Germany .......... 252/62.9 |
| 2359818 | 6/1975 | Fed. Rep. of Germany . |
| 7427896 | 3/1974 | Japan . |

*Primary Examiner*—Jack Cooper
*Attorney, Agent, or Firm*—Oblon, Fisher, Spivak, McClelland & Maier

[57] ABSTRACT

A piezoelectric ceramic composition which comprises the combination of a pyrochlore composite oxide $Ba_2Sb_2O_7$, and a base ceramic mixture of $PbTiO_3$ and $PbZrO_3$.

1 Claim, 5 Drawing Figures

3
FERROMAGNETICPIEZOELECTRIC CERAMIC COMPOSITION

CROSS REFERENCE TO RELATED APPLICATIONS

This is a continuation, of application Ser. No. 709,714, filed July 29, 1976, now abandoned which is a continuation-in-part application Ser. No. 420,653, filed Nov. 30, 1973, now U.S. Pat. No. 4,087,366.

BACKGROUND OF THE INVENTION

1. FIELD OF THE INVENTION

This invention relates to a piezoelectric ceramic composition. More particularly, it relates to a piezoelectric ceramic composition which has improved dielectric and piezoelectric characteristics.

2. DESCRIPTION OF THE PRIOR ART

Barium titanate type ceramic compositions and lead zirconate-titanate type ceramic compositions have been used as piezoelectric ceramic compositions. These compositions, however, are not stable industrial compositions. Therefore, efforts have been directed to developing improved piezoelectric compositions. One of these improved compositions is a ternary system of a solid solution of $Pb(Mg_{\frac{1}{3}}.Nb_{\frac{2}{3}})O_3$-$PbTiO_3$-$PbZrO_3$. It has also been proposed to modify and improve the piezoelectric properties of the composition by the addition of an oxide of Mn, Cr, Co, Fe or Ni to the basic composition. One of the problems with this composition is the moisture absorbing property of the composition containing Mg which interfers with accurate weighing of the composition and the storage of the starting materials. Although the composition has an electromechanical coupling coefficient, Kp of 50–58%, the dielectric loss of the composition is as high as 2–2.4%.

In the ternary solid solution of the base ceramic components of $PbTiO_3$-$PbZrO_3$ and the additive, $Pb(Mn_{\frac{1}{3}}Sb_{\frac{2}{3}})O_3$, the dielectric constant $\epsilon$ and the electro-mechanical coupling coefficient Kp are easily changed by small changes in the components. Compositions having Kp values greater than 50% have low dielectric constants of about 500. Since compositions having a dielectric constant greater than 1000 have been limited to rather narrow ranges of the components, the number of industrially suitable piezoelectric has been limited to a relative few. The compositions of the prior art have been combinations of the above base ceramics components and a perovskite type component, $ABO_3$.

Other proposed improvements for the compositions have involved the addition of certain additives to the base ceramic components of $PbTiO_3$-$PbZrO_3$. For example, in one procedure, the basic ceramic composition has been modified by substituting Pb by Sr and by the addition of a component $Sb_2O_3$ and $MnO_2$. Up to the present, the most effective modified piezoelectric composition has been one whose base ceramic components of $PbTiO_3$ and $PbZrO_3$ are in a ratio of 47:53 and which has had values of Kp=60%, $\epsilon$=1750 and tan $\delta$=2.5%. However, these compositions have had the disadvantage that their performance characteristics are readily changed by the small changes in their component structure. For example, a change in the quantity of Mn of 0.15 wt. % causes a change of Qm from about 1170 to about 300. If it is desired to decrease the tan $\delta$ value to 1.0% by adding another component, the value of Kp changes from 60% to 4.83%. To the present, piezoelectric ceramic compositions having the desired combination of Kp, $\epsilon$, Qm and tan $\delta$ values which are stable to small changes in the component makeup of the composition have not been obtained.

A need therefore, continues to exist for piezoelectric compositions which have Kp, $\epsilon$, Qm and tan $\delta$ values which are stable to small changes in the component makeup of the compositions, and which have high piezoelectric constants.

SUMMARY OF THE INVENTION

Accordingly, one object of the invention is to provide a piezoelectric ceramic composition having a high piezoelectic consant and stability which has an optimum balance of the electro-mechanical coupling coefficient Kp, the dielectric constant $\epsilon$, the mechanical quality factor Qm and the low dielectric loss factor tan $\delta$.

Another object of the invention is to provide a piezoelectric ceramic composition having a high stability to applied voltages and high flex strength which has improved dielectic and piezoelectric characteristics.

Yet another object of the invention is to provide a piezoelectic ceramic composition which is useful as a high power ultrasonic transducer in water or as a wide band filter element.

Briefly, these objects and other objects of the invention as hereinafter will become more readily apparent can be attained by providing a piezoelectric ceramic composition which comprises the combination of a pyrochlore complex oxide $Ba_2Sb_2O_7$ and a mixture of $PbTiO_3$-$PbZrO_3$ ceramic components.

BRIEF DESCRIPTION OF THE DRAWINGS

A more complete appreciation of the invention and many of the attendant advantages thereof will be readily obtained as the same becomes better understood by reference to the following detailed description when conidered in connection with the accompanying drawings, wherein.

DETAILED DESCRIPTION OF THE PREFERRED EMBODIMENTS

The piezoelectric ceramic, solid solution composition of the invention has the following characteristics: Kp of 60% to 74.5%, $\epsilon$ of about 1000 to 1800 and a tan $\delta$ value of less than 0.3%.

Figure 1:
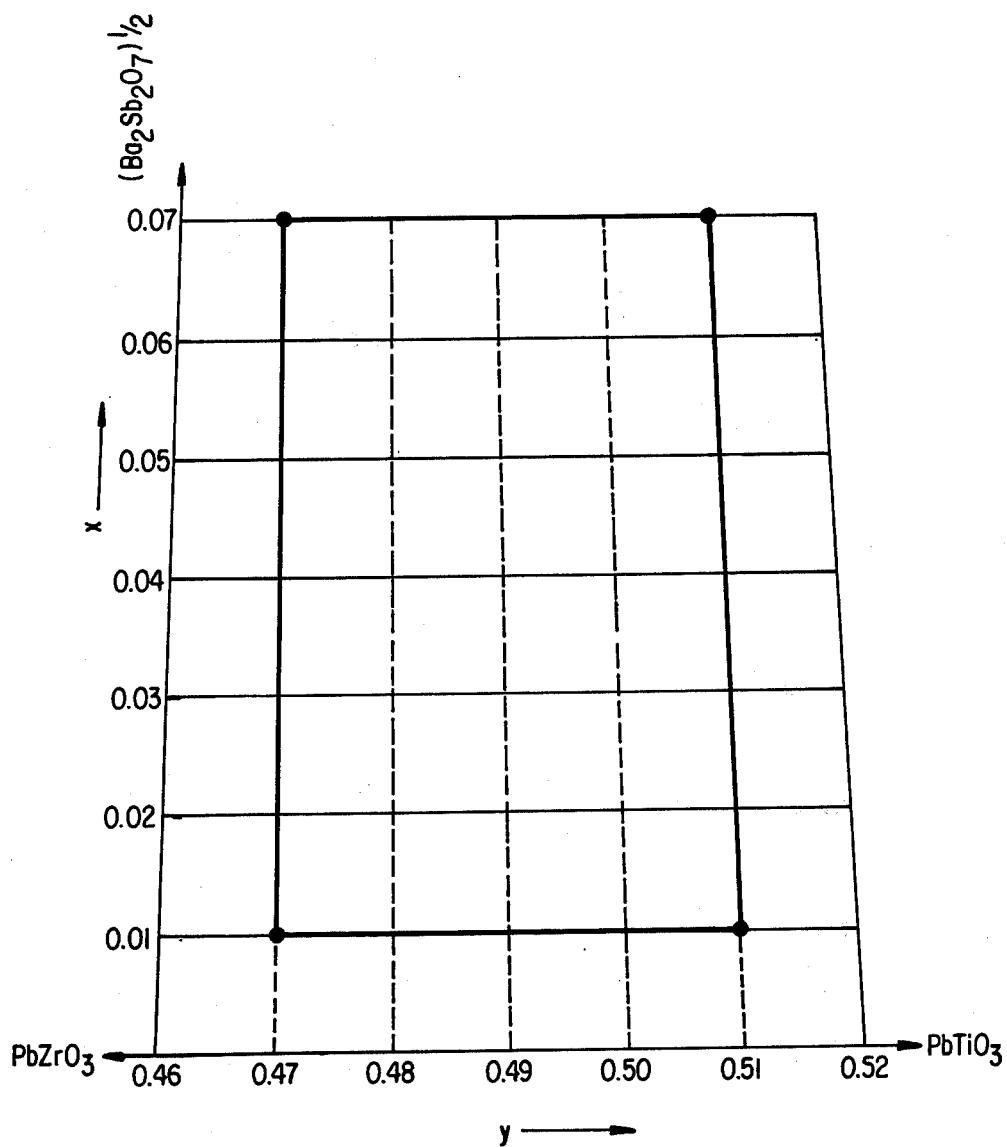
FIG. 1 is a partial view of the triangular coordinate of the ternary system solid solution of the invention.

Pyrochlore type composite oxides which the present composition contains have complicated structures having 8 structural units per unit cell. In addition, the $SbO_6$ component of the pyrochlore oxide has zig-zag chains of O—Sb—O and one oxygen atom which is bounded by four barium atoms. The latter group is independent of the Sb atom. When the pyrochlore type co posite oxide of $Ba_2Sb_2O_7$ is combined with the base ceramic components of $PbTiO_3$ and $PbZrO_3$ and the mixture is sintered at a temperature greater than 1000° C., a piezoelectric ceramic composition having the following formula is formed:

$$x(Ba_2Sb_2O_7)_{\frac{1}{2}}.(1-x)[yPbTiO_3.zPbZrO_3]$$

wherein $0.51 \leq y \leq 0.47$, $0.49 \leq z \leq 0.53$, $y+z=1.0$ and $0.01 \leq x \leq 0.07$, preferably $0.50 \leq y \leq 0.48$, $0.50 \leq z \leq 0.52$, $y+z=1.0$ and $0.02 \leq x \leq 0.05$. The mixture of pyrochlore composite oxide and the ceramic component can be calcined before it is sintered. Preferably, Mn is added to the composition as $MnO_2$ in quantities of 0.1-1.0 wt.%, preferably 0.3 to 0.7 wt.% relative to the total basic components. FIG. 1 is a triangular coordinate system of the ternary solid solution $x(Ba_2Sb_2O_7)_{\frac{1}{2}}.(1-x)$ [$yPbTiO_3.zPbZrO_3$] of the invention.

The compositions of the invention which are suitable for broad applications and practical uses, have ratios of $PbTiO_3$ to $PbZrO_3$ of 46-54:54-46 mole % and $Pb(Ti.Zr)O_3$ to $(Ba_2Sb_2O_7)_{\frac{1}{2}}$ ratios of 99-93:1-7 mole %.

The compositions, have Kp values greater than about 60%, $\epsilon$ values greater than about 1000 and tan $\delta$ of less than 0.3%. The piezoelectric properties of the compositions are continuous in the range of 1-7 mole % of $(Ba_2Sb_2O_7)_{\frac{1}{2}}$, so that the stability of the composition is remarkably high as shown in Table 2.

When Mn is present in the composition, the mechanical quality factor Qm can be increased to about 1800 to 3200 and the dielectric loss tan $\delta$ is decreased to less than 0.3 %. However, the dielectric constant and the electromechanical coupling coefficient do not fluctuate much, so that a remarkable combination of characteristics of Kp, $\epsilon$, tan $\delta$ and Qm can be obtained. Thus, the composition can be readily mass produced.

The improved characteristics exhibited by the compositions of the invention fluctuate only very slowly when the amounts of the components are altered because the complex pyrochlore oxides having long-range forces which are characteristic of the pyrochlore oxides. They are very different from the $ABO_3$ type compounds.

The ferroelectric piezoelectric ceramic compositions of the invention have the characteristics of being continuously stable while showing only slight fluctuations of the characteristics when the components of the compositions are changed only slightly. Thus, the industrial advantages for these compositions are substantial.

The combined characteristics of the compositions of the invention are very good, and as a result, the dielectric characteristics exhibit a high degree of stability to changes of the applied voltage. In comparison to the low stability of the conventional compositions, the solid solutions containing the pyrochlore complex oxides of the invention have remarkable stability.

The important feature of the invention is to separately prepare pyrochlore composite oxide $Ba_2Sb_2O_7$ and the basic ceramic components of $PbTiO_3$ and $PbZrO_3$ and then they are admixed together with a manganese component and the mixture is sintered. It is preferable to calcine the mixture of the pyrochlore composite oxide and the basic ceramic components of $PbTiO_3$ and $PbZrO_3$ and manganese oxide and then to crush the calcined mixture and to mold the powder of the calcined mixture and to sinter the molded mixture. The mixture of the pyrochlore composite and the basic ceramic components of $PbTiO_3$ and $PbZrO_3$ and manganese oxide is sintered at higher than 1000° C. and usually at 1000° to 1300° C. preferably 1000° to 1200° C. whereby the pyrochlore composite is firstly melted to form the liquid phase and the basic ceramic components of $PbTiO_3$ and $PbZrO_3$ are converted in the liquid phase of the pyrochlore composite to form the piezoelectric ceramic composition.

Since the components of the pyrochlore composite and the basic ceramic components are sintered, the form of solid solution is different in the sintering step.

Since the basic ceramic components are converted in the liquid phase of the pyrochlore composite, in the sintering step, fine grains such as less than $5\mu$ especially 1.0 to $2.5\mu$ of a diameter are formed and the grain boundary contains higher content of impurities.

When the solid phase reaction for all components is performed, the grain size is too large and a desirable product can not be obtained. When all components are melted at once in the sintering step a desirable product can not be obtained. When the pyrochlore composite is firstly melted and the basic ceramic components of $PbTiO_3$ and $PbZrO_3$ are converted, the fine grain size product can be obtained. The additive of manganese oxide is important for improving the characteristics of the product. The degrees of variations of the characteristics of Qm, $\epsilon v/\epsilon$, and tan $\delta$ depending upon change of terminal voltage applied to the products are relatively decreased by the addition of the manganese oxide for example as stated in the examples. It is preferable to obtain a product which has low variations of characteristics under change of voltage applied especially in high voltage.

The fact can be considered as good linearities of the output characteristics depending upon change of the input.

When the grain size is decreased, the mechanical strength of the product is increased. When the pyrochlore composite is not preliminarily prepared by the calcination of the raw materials and only the components of barium oxide and antimony oxide are mixed without preparing the pyrochlore, the liquid phase of the pyrochlore is not formed in the sintering step and it is impossible to form fine grains.

The advantages of the piezoelectric ceramic composition of the invention are attained by the formation of the fine grains resulted by the liquid phase conversion and the effect of manganese oxide to decrease the degrees of variations of characteristics depending upon change of voltage applied.

When the piezoelectric ceramic compositions are used in an ultrasonic transducer, the input load increases in the generation of high power ultrasonic waves. The stability of the dielectric loss (tan $\delta$)-voltage characteristics is important in this regard.

An increase in the tan $\delta$ value means an increase in the amount of heat which is not desirable. The mechanical quality factor Qm which is in a reciprocal relationship to tan $\delta$, is also very stable to changes in the voltage.

Figure 3:
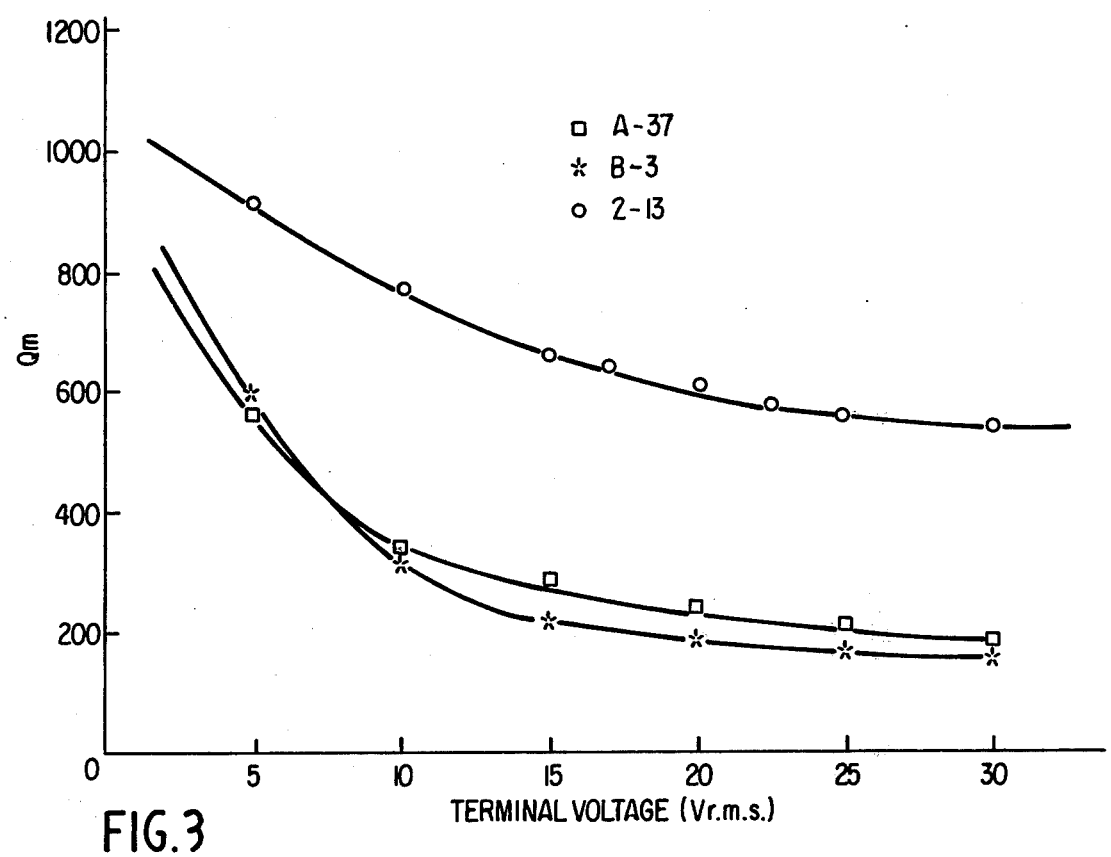
FIG. 3 is a graph showing the relationship of mechanical quality factor (Qm) versus terminal voltage of several piezoelectric compositions including some prior art compositions.
Figure 4:
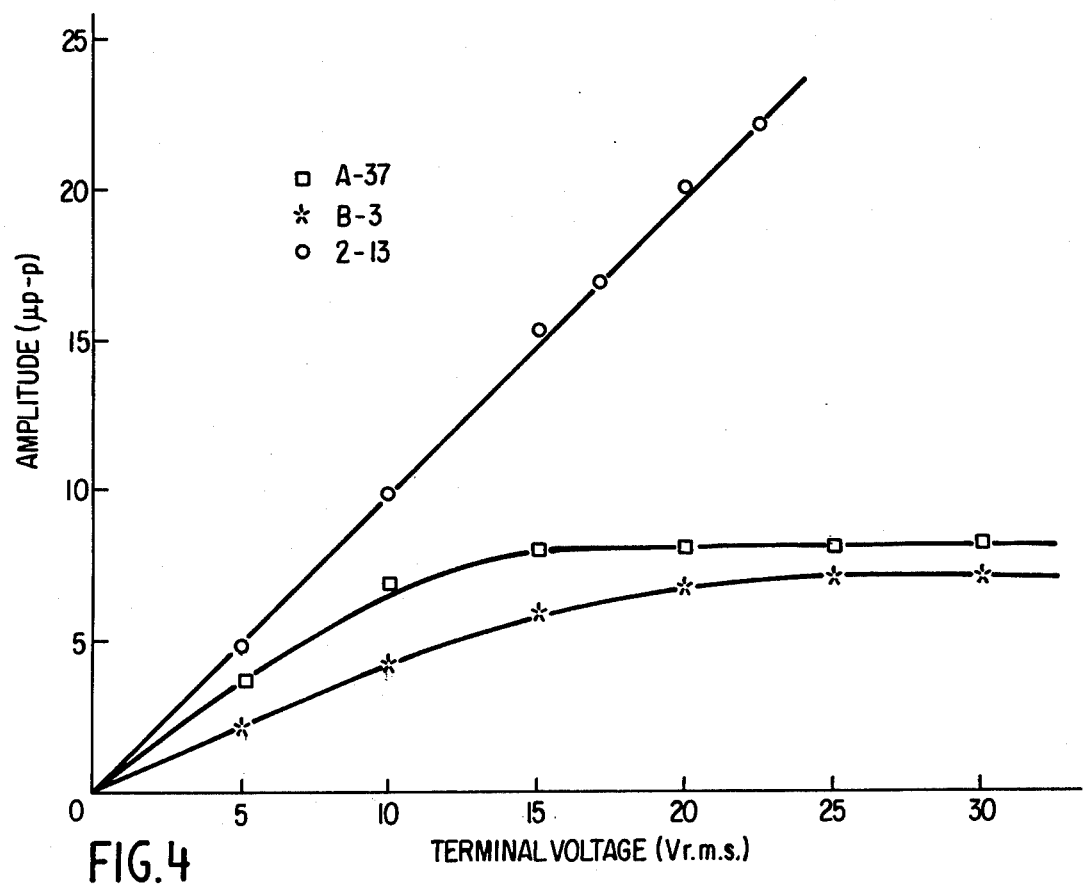
FIG. 4 is a graph showing the relationship of amplitude ($\mu$) versus terminal voltage of several piezoelectric compositions including some prior art compositions.

FIGS. 3 & 4 shows the relationship of the mechanical quality factor Qm of a bolt fitted Langevin transducer (30 mm diameter) and the amplitude $\mu$ under non-loaded conditions in air, which shows excellent overall piezoelectric characteristics with excellent dielectric characteristics.

When a conventional transducer is resonated in a range of 0-30 volts, the transducer shows a sudden decrease in the mechanical quality factor Qm at about 10 volts, and the amplitude is limited to 3-4$\mu$. However, transducers made of the composition of the invention show a high stability for the mechanical quality Q factor as shown in FIG. 3. With these transducers it is possible to transduce forcibly at a level of 50 volts to generate high intensity ultrasonic power. Also, the transducer does not deteriorate with increasing applied voltages. Since the solid solutions of the invention contain the pyrochlore complex oxides, they exhibit stability to applied voltages which is a fundamental characteristic of the pyrochlore oxides. If the solid solutions contain from 1.0–7.0 mole % of the pyrochlore complex oxide, they exhibit the desired fundamental characteristics of the pyrochlore oxide.

When the temperature coefficient of the dielectric constant $\epsilon$-T.C. is high and the piezoelectric ceramic composition itself is heated, changes in the dielectric constant $\epsilon$ increase while the impedance changes which means that the impedance matching deteriorates and, accordingly, the maximum amplitude cannot be attained. However, the piezoelectric ceramic compositions of the invention have excellent temperature efficiency.

The piezoelectric ceramic compositions of the invention have suitable piezoelectric characteristics as ultrasonic transducers. The composition of the invention can also be effectively used in various elements such as ceramic filters, accelerometers, pick-ups and the like, without limiting the effectiveness of the ultrasonic transducer as the three components of the composition are varied or as the amount of manganese additive is varied.

Having generally described this invention, a further understanding can be obtained by reference to certain specific examples which are provided herein for purposes of illustration only and are not intended to be limiting unless otherwise specified.

cined at about 900° C. The resulting $Ba_2Sb_2O_7$, $PbTiO_3$ and $PbZrO_3$ components were weighed and mixed to provide compositions with the atomic ratios of x, y, z shown in Table 1. The mixture was further crushed, mixed by a ball mill and was molded under pressure of 1.5 ton/$cm^2$ to form a 20 mm diameter disc with a thickness of 1 mm. The disc was sintered at 1200°–1250° C. for 2 hours to prepare a ferroelectric piezoelectric ceramic composition. The composition was then used as a piezoelectric element in the conventional manner. A pair of Ag electrodes was placed on both sides of the disc of the piezoelectric element and then the disc was dipped into silicon oil at 100°–150° C. A DC voltage of 3 KV/mm was impressed across the electrodes for 1 hour to polarize them. The disc was operated for 24 hours, and in order to evaluate the piezoelectric properties, i.e., the electromechanical coupling coefficient (Kp) and the mechanical quality factor (Qm), the I.R.E. standard circuit method was used. The coefficient Kp was calculated by the resonant frequency (f r) and the antiresonant frequency (f a). The dielectric constant ($\epsilon$) and the dielectric loss (tan $\delta$) were made under a frequency of 1 KHz. The value of CTC was measured as a temperature coefficient of $\epsilon$.

The piezoelectric properties of various $(1-x)Pb(Ti_y.Zr_z)O_3.x(Ba_2Sb_2O_7)_{\frac{1}{2}}$ compositions are shown in Table 1, wherein the amounts of the components and the resulting compositions are shown by x, $1-x$, y and z. [$x(Ba_2Sb_2O_7)_{\frac{1}{2}}$ and $(1-x)(y\ PbTiO_3-zPbZrO_3)$ were combined to form a solid solution.] As is clear from Table 1, high electromechanical coupling coefficients Kp were obtained over a relatively broad range, and the optimum values of Qm, $\epsilon/\epsilon_o$ and tan $\delta$ which are necessary for the intended purposes of the composition vary according to the broad range compositions selected.

TABLE 1

| No. | x | 1-x | Mn as $MnO_2$ (wt.%) | y | z | $\epsilon/\epsilon_o$ | tan $\sigma$ (%) | Kp (%) | Qm | (ppm/°C.) | flex strength (kg/$cm^2$) |
|---|---|---|---|---|---|---|---|---|---|---|---|
| 1-1 | 0.20 | 0.80 | 0 | 0.80 | 0.20 | 590 | 2.0 | 22.0 | 210 | 1780 | 930 |
| 1-2 | 0.20 | 0.80 | 0 | 0.50 | 0.50 | 3320 | 2.3 | 36.5 | 130 | 970 | 920 |
| 1-3 | 0.10 | 0.90 | 0 | 0.54 | 0.46 | 1530 | 1.9 | 58.9 | 82 | 1090 | 920 |
| 1-4 | 0.10 | 0.90 | 0 | 0.46 | 0.54 | 3050 | 2.1 | 61.2 | 70 | 960 | 930 |
| 1-5 | 0.05 | 0.95 | 0 | 0.60 | 0.40 | 900 | 1.5 | 36.5 | 100 | 1070 | 920 |
| 1-6 | 0.05 | 0.95 | 0 | 0.52 | 0.48 | 1890 | 1.9 | 60.2 | 70 | 990 | 920 |
| 1-7 | 0.05 | 0.95 | 0 | 0.40 | 0.60 | 920 | 2.2 | 45.5 | 80 | 1250 | 930 |
| 1-8 | 0.01 | 0.99 | 0 | 0.52 | 0.48 | 1360 | 1.5 | 68.7 | 75 | 990 | 930 |
| 1-9 | 0.03 | 0.97 | 0 | 0.47 | 0.53 | 1900 | 1.9 | 74.6 | 65 | 1100 | 930 |
| 1-10 | 0.03 | 0.97 | 0 | 0.49 | 0.51 | 2050 | 1.8 | 76.6 | 65 | 1100 | 930 |
| 1-11 | 0.03 | 0.97 | 0 | 0.51 | 0.49 | 2070 | 1.8 | 76.5 | 67 | 990 | 920 |
| 1-12 | 0.05 | 0.95 | 0 | 0.47 | 0.53 | 1850 | 2.1 | 75.2 | 65 | 1150 | 920 |
| 1-13 | 0.05 | 0.95 | 0 | 0.49 | 0.51 | 2010 | 2.0 | 74.8 | 65 | 1150 | 930 |
| 1-14 | 0.05 | 0.95 | 0 | 0.51 | 0.49 | 1950 | 1.9 | 73.4 | 67 | 1000 | 920 |
| 1-15 | 0.07 | 0.93 | 0 | 0.47 | 0.53 | 1650 | 2.0 | 72.4 | 80 | 1150 | 920 |
| 1-16 | 0.07 | 0.93 | 0 | 0.49 | 05.1 | 1880 | 2.0 | 69.5 | 75 | 1150 | 920 |
| 1-17 | 0.07 | 0.93 | 0 | 0.51 | 0.49 | 1950 | 1.9 | 66.8 | 75 | 1100 | 930 |

REFERENCE EXAMPLE 1

PbO, $TiO_2$, $ZrO_2$, BaO and $Sb_2O_5$ were used as the starting powdery materials for the preparation of a piezoelectric ceramic composition. ($Sb_2O_3$ can be used instead of $Sb_2O_5$ in equimolar amounts.) The starting powdery materials were weighed and mixed to provide the $Ba_2Sb_2O_7$, $PbTiO_3$, and $PbZrO_3$ components. The mixed starting powdery materials were mixed well in a separate ball mill and the mixture was molded and cal-

EXAMPLE 2

The procedure of the preparation of Reference Example 1 was followed except that $MnO_2$ was added to the basic components. The piezoelectric compositions were prepared and the piezoelectric properties were measured as shown in Table 2. As is clear from Table 2, the addition of $MnO_2$ resulted in substantial improvements in the values of Qm and tan $\delta$.

TABLE 2

| No. | x | 1-x | Mn as MuO$_2$ (wt.%) | y | z | $\epsilon/\epsilon_0$ | tan δ (%) | Kp (%) | Qm | CTC (ppm/°C.) | flex strength (Kg/cm$^2$) | grain size (μ) |
|---|---|---|---|---|---|---|---|---|---|---|---|---|
| 2-1 | 0.01 | 0.99 | 0 | 0.48 | 0.52 | 1680 | 1.8 | 73.5 | 60 | 1030 | 930 | 8.0 |
| 2-2 | 0.01 | 0.99 | 0.05 | 0.48 | 0.52 | 1510 | 0.5 | 71.2 | 1830 | 1010 | 1050 | 3.8 |
| 2-3 | 0.01 | 0.99 | 0.1 | 0.48 | 0.52 | 1440 | 0.3 | 70.8 | 2370 | 990 | 1130 | 2.2 |
| 2-4 | 0.01 | 0.99 | 0.3 | 0.48 | 0.52 | 1320 | 0.3 | 68.6 | 2880 | 950 | 1210 | 1.8 |
| 2-5 | 0.01 | 0.99 | 0.5 | 0.48 | 0.52 | 1280 | 0.2 | 65.2 | 3030 | 890 | 1275 | 1.5 |
| 2-6 | 0.01 | 0.99 | 1.0 | 0.48 | 0.52 | 975 | 0.3 | 59.9 | 2460 | 930 | 1280 | 1.2 |
| 2-7 | 0.01 | 0.99 | 3.0 | 0.48 | 0.52 | 830 | 0.6 | 52.7 | 1450 | 1050 | 1150 | 1.1 |
| 2-8 | 0.01 | 0.99 | 0.5 | 0.47 | 0.53 | 1340 | 0.20 | 69.1 | 2900 | 800 | 1270 | 1.4 |
| 2-9 | 0.01 | 0.99 | 0.5 | 0.49 | 0.51 | 1410 | 0.2 | 70.0 | 2670 | 800 | 1270 | 1.5 |
| 2-10 | 0.01 | 0.99 | 0.5 | 0.51 | 0.49 | 1540 | 0.20 | 72.0 | 2400 | 900 | 1270 | 1.6 |
| 2-11 | 0.03 | 0.97 | 0.5 | 0.47 | 0.53 | 1700 | 0.16 | 71.0 | 2100 | 1070 | 1280 | 1.5 |
| 2-12 | 0.03 | 0.97 | 0.5 | 0.49 | 0.51 | 1770 | 0.16 | 73.5 | 2060 | 1040 | 1280 | 1.7 |
| 2-13 | 0.03 | 0.97 | 0.5 | 0.495 | 0.505 | 1800 | 0.15 | 74.5 | 2000 | 1020 | 1280 | 1.6 |
| 2-14 | 0.03 | 0.97 | 0.5 | 0.50 | 0.50 | 1840 | 0.15 | 74.0 | 1890 | 1050 | 1270 | 1.5 |
| 2-15 | 0.03 | 0.97 | 0.5 | 0.51 | 0.49 | 1810 | 0.16 | 73.0 | 2040 | 1050 | 1270 | 1.5 |
| 2-16 | 0.05 | 0.95 | 0.5 | 0.47 | 0.53 | 1740 | 0.20 | 72.2 | 2600 | 1000 | 1280 | 1.7 |
| 2-17 | 0.05 | 0.95 | 0.5 | 0.49 | 0.51 | 1670 | 0.18 | 71.6 | 2520 | 980 | 1280 | 1.6 |
| 2-18 | 0.05 | 0.95 | 0.5 | 0.51 | 0.49 | 1600 | 0.18 | 69.8 | 2700 | 1030 | 1280 | 1.6 |
| 2-19 | 0.07 | 0.93 | 0.5 | 0.47 | 0.53 | 1550 | 0.22 | 68.7 | 2100 | 1200 | 1280 | 1.8 |
| 2-20 | 0.07 | 0.93 | 0.5 | 0.49 | 0.51 | 1480 | 0.20 | 65.0 | 2400 | 1180 | 1280 | 1.7 |
| 2-21 | 0.07 | 0.93 | 0.5 | 0.51 | 0.49 | 1410 | 0.20 | 62.8 | 3200 | 1180 | 1280 | 1.6 |

EXAMPLE 3

Various known or prior art piezoelectric compositions were compared to Examples 2-13 and 2-19 with regard to dielectric loss (tan δ), the mechanical quality factor (Qm), $\epsilon v/\epsilon_0$ and amplitude which can be referred to as the kinetic characteristics of a piezoelectric composition as a function of terminal voltage.

SAMPLE A-37

The composition of sample 37 (herein designated as A-37) of Table 4 of USP 3,518,199, was prepared as a reference example. PbO, TiO$_2$, ZrO$_2$, Fe$_2$O$_3$ and Sb$_2$O$_3$ were mixed in a ball-mill in the following quantities indicated as mole percent.

Pb(Fe$_\frac{1}{2}$Sb$_\frac{1}{2}$)O$_3$—10 mole %
PbTiO$_3$—43 mole %
PbZrO$_3$—47 mole %

The mixture was calcined at 900° C. for 1 hour. A 0.3 weight % quantity of MnO$_2$ was added to the mixture and the resulting mixture was crushed, mixed and pressed in a mold and was sintered at 1280° C. for 1 hour.

SAMPLE B-3

The composition of Sample 3 (herein designated as B-3) of Table 1 of USP 3,649,540 was prepared as a reference example. PbO, TiO$_2$, ZrO$_2$, Nb$_2$O$_5$ and Cu$_2$O were mixed in a ball-mill in the following quantities indicated as mole percent.

Pb(Cu$_\frac{1}{4}$Nb$_\frac{3}{4}$)O$_3$—6 mole %
PbTiO$_3$—44 mole %
PbZrO$_3$—50 mole %

The mixture was calcined at 900° C. for 2 hours. A 0.5 weight % amounts of MnO$_2$ was added to the mixture and the resulting mixture was crushed, mixed and pressed in a mold and was sintered at 1200° C. for 1 hour.

SAMPLE RION NO. 13

The composition of sample Rion No. 13 (herein designated as Rion 13) of German patent 2,001,290, was prepared as a reference example. PbO, TiO$_2$, ZrO$_2$ and Nb$_2$O$_5$ were mixed in a ball-mill in the following quantities indicated as mole percent.

PbTiO$_3$—43 mole %
PbZrO$_3$—51.5 mole %
PbO—11 mole %
Nb$_2$O$_5$—5.5 mole %

The mixture was calcined at 900° C. for 1 hour and was crushed and pressed in a mold and was sintered at 1260° C. for 1 hour.

Samples of all compositions were shaped into discs having a diameter of 30 mm and a thickness of 2 mm. A DC voltage of 3 KV/mm was applied across each sample disc for one hour in a silicon oil both at 100° C. to polarize the discs. The discs were kept for 24 hours after which time the piezoelectric characteristics were measured as shown in Table 3 below.

TABLE 3

| SAMPLE | $\epsilon/\epsilon_0$ | tan δ | Kp (%) | Qm | grain size (μ) |
|---|---|---|---|---|---|
| A-37 | 600 | 0.8% | 58.0 | 1800 | 5.0 |
| B-3 | 1000 | 0.7% | 58.0 | 1850 | 6.5 |
| Rion 13 | 1200 | 2.8% | 60.0 | 100 | 7.8 |
| 2-13 | 1800 | 0.15% | 74.5 | 2000 | 1.6 |
| 2-19 | 1550 | 0.2% | 68.7 | 2400 | 1.8 |

The degrees of variation of the characteristics of μ, Qm, $\epsilon v/\epsilon$ and tan δ depending upon the change of terminal voltage applied to the products are shown in Table 4.

TABLE 4

| (μ) | Terminal Voltage (V.r.m.s.) | | | | |
|---|---|---|---|---|---|
| | 5 | 10 | 15 | 20 | 30 |
| Rion No. 13 | 0.8 | 1.5 | 2.0 | 2.1 | 2.1 |
| B-3 | 2.0 | 4.0 | 6.1 | 6.8 | 7.2 |
| A-37 | 3.5 | 6.4 | 7.9 | 8.0 | 8.1 |
| 2-1 | 3.4 | 6.3 | 8.2 | 9.5 | 10.5 |
| 2-2 | 3.5 | 6.4 | 9.6 | 12.2 | 16.5 |
| 2-3 | 4.0 | 8.0 | 12.2 | 16.3 | 23.9 |
| 2-4 | 4.2 | 8.4 | 12.5 | 16.7 | 25.0 |
| 2-5 | 4.9 | 10.0 | 15.5 | 20.3 | 28.8 |
| 2-6 | 4.4 | 9.0 | 13.2 | 17.8 | 26.5 |
| 2-7 | 3.5 | 6.5 | 9.8 | 13.2 | 17.5 |
| 2-9 | 5.5 | 11.0 | 16.5 | 22.0 | 31.2 |
| 2-13 | 5.0 | 10.1 | 15.4 | 20.6 | 30.8 |
| 2-19 | 5.3 | 10.3 | 15.6 | 20.8 | 31.0 |

TABLE 4'

| (Qm) | Terminal Voltage (V.r.m.s.) | | | | |
|---|---|---|---|---|---|
| | 5 | 10 | 15 | 20 | 30 |
| Rion No. 13 | 250 | 195 | 165 | 140 | 120 |
| B-3 | 560 | 340 | 290 | 250 | 210 |
| A-37 | 600 | 320 | 220 | 190 | 180 |
| 2-1 | 300 | 300 | 225 | 210 | 200 |
| 2-2 | 700 | 650 | 550 | 450 | 380 |
| 2-3 | 860 | 710 | 670 | 600 | 560 |
| 2-4 | 870 | 745 | 680 | 620 | 580 |
| 2-5 | 900 | 810 | 720 | 660 | 610 |
| 2-6 | 900 | 770 | 660 | 610 | 550 |
| 2-7 | 730 | 585 | 490 | 470 | 370 |
| 2-9 | 970 | 820 | 750 | 700 | 650 |
| 2-13 | 910 | 800 | 720 | 670 | 620 |
| 2-19 | 930 | 810 | 730 | 680 | 630 |

TABLE 4''

| (ϵ/ϵ) | Terminal Voltage (V) | | |
|---|---|---|---|
| | 500 | 1000 | 1500 |
| Rion No. 13 | 16.5 | too high | too high |
| B-3 | 6.5 | 20.0 | 38.5 |
| A-37 | 5.0 | 15.0 | 24.5 |
| 2-1 | 8.0 | 23.0 | 43.0 |
| 2-2 | 3.0 | 8.0 | 14.8 |
| 2-3 | 2.5 | 5.1 | 7.6 |
| 2-4 | 2.1 | 3.9 | 5.7 |
| 2-5 | 2.0 | 2.8 | 4.0 |
| 2-6 | 2.2 | 4.0 | 6.0 |
| 2-7 | 3.1 | 9.2 | 17.5 |
| 2-9 | 1.7 | 3.3 | 5.0 |
| 2-13 | 2.0 | 3.7 | 5.7 |
| 2-19 | 2.1 | 3.8 | 5.8 |
| (tan δ %) | | | |
| Rion No. 13 | 17.0 | too high | too high |
| B-3 | 9.0 | 22.0 | 43.0 |
| A-37 | 5.0 | 15.0 | 29.0 |
| 2-1 | 8.0 | 25.0 | 46.5 |
| 2-2 | 2.5 | 5.5 | 8.2 |
| 2-3 | 1.0 | 2.2 | 3.4 |
| 2-4 | 0.9 | 1.9 | 2.8 |
| 2-5 | 0.8 | 1.6 | 2.5 |
| 2-6 | 1.0 | 2.1 | 3.2 |
| 2-7 | 2.0 | 7.5 | 16.0 |
| 2-9 | 0.6 | 1.5 | 2.2 |
| 2-13 | 0.8 | 1.7 | 2.5 |
| 2-19 | 0.9 | 1.8 | 2.6 |

Figure 2A:
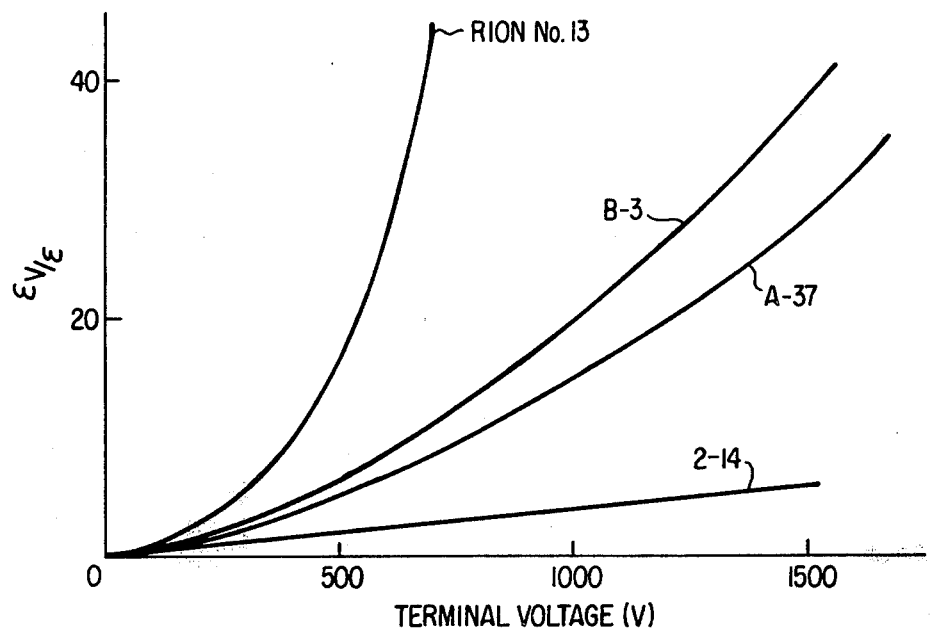
FIGS. 2A and 2B are graphs showing the relationship of dielectric constant and dielectric loss, respectively versus terminal voltage of several piezoelectric compositions including some prior art compositions.
Figure 2B:
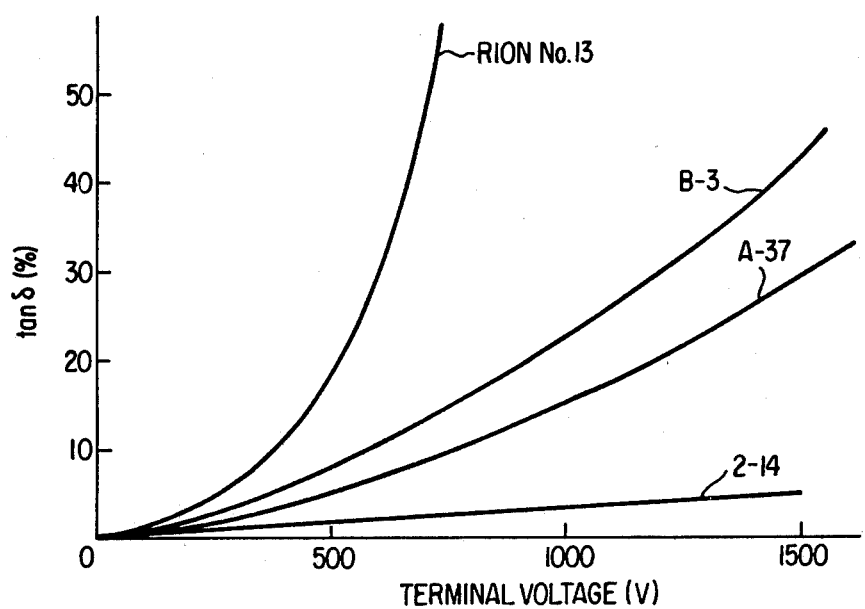

The dielectric constant and dielectric loss of each sample disc as a function of terminal voltage (V) were measured as shown in FIGS. 2A and 2B. It is apparent from these graphs that the dielectric loss and the dielectric constant of each of the reference samples (samples A-37, B-3 and Rion 13) increase substantially with increasing terminal voltage. The sample designated as Rion 13 is especially poor in that at relatively low terminal voltages, it experiences sharp increases in the dielectric constant and sharp dielectric losses. Sample 2-19 of the present invention, on the other hand, experiences very little change in either dielectric constant or dielectric loss over the full range of terminal voltage employed.

Samples of reference compositions A-37 and B-3 as well as a sample of Examples 2-13 of the present invention were shaped into rings having the following dimensions:

10 mm inner diameter
30 mm outer diameter
5 mm thickness

Two sheets of rings of each sample were bolt-fitted to a Langevin transducer which was used to measure the mechanical quality factor (Qm) as a function of terminal voltage by an admittance bridge as shown in FIG. 3. The amplitude ($\mu$) of each sample was also determined as a function of terminal voltage as shown in FIG. 4.

Referring to FIG. 3, it can be readily ascertained that reference compositions A-37 and B-3 experience very substantial reductions in their mechanical quality factors over the terminal voltage range employed. On the other hand, sample 2-13 of the present invention does not experience nearly as much a loss in mechanical quality as the prior art samples, and in fact experiences only a rather moderate initial loss which then tend to level off at rather substantial values.

Referring to the amplitude versus terminal voltage portion of FIG. 4, it can be readily determined by just a casual inspection of the graph that as the input voltage is increased upon one of the pyrochlore ceramic compositions of the present invention, i.e. sample 2-13, the terminal voltage correspondingly increases in a linear relationship throughout the range of amplitude versus voltage measured. Referring now to the plots for the two prior art compositions tested (A-37 and B-3) it can be readily determined that the linear relationship which exists with the present composition does not exist with any of the prior art compositions. Both prior art compositions only show an initial increase in the amplitude factor as a function of terminal voltage, but than rapidly level off to a more or less constant amplitude value at increasingly higher terminal voltages. These data clearly show the superior amplitude properties of the composition of the present invention which are clearly absent in all of the prior art compositions.

Having now fully described this invention, it will be apparent to one of ordinary skill in the art that many changes and modifications can be made thereto without departing from the spirit or scope of the invention as set forth herein.

What is claimed as new and intended to be secured by letters patent is:

1. A piezoelectric ceramic composition of the formula: $x(Ba_2Sb_2O_7)_{\frac{1}{2}} \cdot (1-x)[y(PbTiO_3)z(PbZrO_3)]$ wherein $0.01 \leq x \leq 0.07$; $0.47 \leq y \leq 0.51$; $0.49 \leq z \leq 0.53$ and $y \pm z = 1.0$ and containing 0.1–1.0 wt.% $MnO_2$ and wherein said piezoelectric ceramic composition possesses a dielectric loss value tan δ less than 0.3%, an electromechanical coupling coefficient Kp of 60% to 74.5% and a dielectric constant ϵ value of 1000 to 1800 prepared by a process, comprising:

individually forming lead titanate, lead zirconate and barium antimonate components by separately calcining mixtures of lead oxide-titanium oxide, lead oxide-zirconium oxide, and barium oxide-antimony oxide;

mixing said components with $MnO_2$ in an amount of 0.1 to 1.0 wt.% to provide a mixture in which said lead titanate, lead zirconate and barium antimonate are present in amounts that satisfy said formula; and sintering said mixture at a temperature greater than 1000° C. to form said piezoelectric composition.

* * * * *